United States Patent [19]
Okitaka et al.

[11] Patent Number: 4,804,867
[45] Date of Patent: Feb. 14, 1989

[54] THREE-STATE COMPLEMENTARY MOS INTEGRATED CIRCUIT

[75] Inventors: Takenori Okitaka; Yukio Miyazaki, both of Itami, Japan

[73] Assignee: Mitsubishi Denki Kabushiki Kaisha, Tokyo, Japan

[21] Appl. No.: 119,086

[22] Filed: Nov. 10, 1987

[30] Foreign Application Priority Data

Nov. 14, 1986 [JP] Japan ................. 61-272602

[51] Int. Cl.$^4$ ............... H03K 3/295; H03K 3/354; H03K 4/48; H03K 17/16
[52] U.S. Cl. ................. 307/473; 307/290; 307/279; 307/452; 307/585; 365/168
[58] Field of Search .......... 307/473, 448, 451, 270, 307/585, 475, 576, 579, 452, 453, 279, 290; 365/168, 226, 228

[56] References Cited

U.S. PATENT DOCUMENTS

| | | | |
|---|---|---|---|
| 4,295,062 | 10/1981 | Mihalich et al. | 307/279 |
| 4,507,649 | 3/1985 | Dingwall et al. | 307/585 X |
| 4,563,594 | 1/1986 | Koyama | 307/451 X |
| 4,733,105 | 3/1988 | Shin et al. | 307/585 X |

FOREIGN PATENT DOCUMENTS 60-48616 3/1985 Japan.

Primary Examiner—Stanley D. Miller
Assistant Examiner—David R. Bertelson
Attorney, Agent, or Firm—Fleit, Jacobson, Cohn & Price

[57] ABSTRACT

In a three-state complementary MOS integrated circuit having an output circuit comprising a P-channel MOS transistor and an N-channel MOS transistor, part of a pre-output stage circuit between the gate inputs of the P-channel MOS transistor and the N-channel MOS transistor of the output circuit comprises a parallel circuit of a first series circuit and a second series circuit, each of the first series circuits comprising a P-channel MOS transistor to which the control signal is applied and an N-channel MOS transistor to which the inverted control signal is applied. When the control signal and the inverted control signal are at the same potential, either the P-channel MOS transistors or the N-channel MOS transistors of the parallel circuit are off. Accordingly totempole current through the pre-output stage circuit is avoided.

4 Claims, 3 Drawing Sheets

THREE-STATE COMPLEMENTARY MOS INTEGRATED CIRCUIT

BACKGROUND OF THE INVENTION

The present invention relates to a three-state complementary MOS integrated circuit and particularly to an improvement for restraining oscillation of the circuit when a slow pulse is applied at the control input.

FIG. 2 shows a three-state complementary MOS integrated circuit in the prior art. In the figure: 1 is an input terminal (IN); 2 is an output terminal (OUT); 3 is a power supply terminal through which a voltage is supplied; 4 is a GND (ground) terminal. The power supply terminal has a positive potential with respect to the ground terminal 4 is a control input $\phi$ for determining the state of the output; 6 is an inverted control input $\bar{\phi}$ which is an inversion of the control input $\phi5$; P1, P2, P3, P4 and P6 are P-channel MOS transistor: N1, N2, N3, N4 and N6 are N-channel transistors; The transistors P1 and N1 form an output circuit 10. The transistors P2 to P4, N2 to N4 form a pre-output stage circuit 20 for driving the output circuit.

Now the operation will be described.

When the control input $\phi5$ is low and the inverted control input $\bar{\phi}6$ is high, the transistors P3 and N3 are off, the transistors P4 and N4 are on and the output is in the ENABLE State. Accordingly, when the input terminal 1 is low, a low-level signal appears on the output terminal 2. When the input terminal 1 is high, a high-level signal appears on the output terminal 2.

When the control input $\phi5$ is high and the inverted control input $\bar{\phi}6$ is low, the transistors P3 and N3 are on and the transistors P4 and N4 are off. Accordingly, the transistors P1 and N1 are off regardless of the state of the input terminal 1, and the output terminal 2 is in the high-impedance state.

FIG. 3 is a timing chart showing the circuit shown in FIG. 2. At the time (I) in FIG. 3, the transistors P2, N4 and N3 are on and the transistors P3, P4 and N2 are off. At the time (II) in FIG. 3, the transistor P3, P4 and N2 are on and the transistors P2, N4 and N3 are off. If the transistors of the pre-output stage circuit that are on at times (I) and (II) are represented by resistors, the equivalent circuits will be as shown in FIG. 4(a) and FIG. 4(b). Thus, a totempole current flows through the pre-output stage circuit at the times (I) and (II).

A three-state complementary MOS integrated circuit in the prior art is configured as described above. The time delay in the potential level transition between the control signal $\phi$ and the inverted control input $\bar{\phi}$ and at the times when the two signals have the same level, a totempole current flows through the pre-outputs stage circuit. As a result, the gate inputs to the output circuit are unstable. A large totempole current flow through the output circuit and causes fluctuation at the GND terminal, thereby causing oscillation of the device.

SUMMARY OF THE INVENTION

The present invention has been made to solve the above problems.

An object of the invention is to provide a three-state complementary MOS intergrated circuit which can prevent the totempole current from flowing through the pre-output stage circuit even at the times when the control input and the inverted control input are at the same potential level, and thereby prevent oscillation of the device.

A three-state complementary MOS integrated circuit according to the invention is characterized in that the part of the pre-output stage circuit between the gate inputs of the P-channel and N-channel MOS transistor of the output circuit comprises a parallel circuit of a first series circuit and a second series circuit, the first series circuit comprising a P-channel MOS transistor and an N-channel MOS transistor that are connected in series, the control signal being applied to the P-channel MOS transistor, and the inverted control signal being applied to the N-channel MOS transistor, and the second series circuit comprising a P-channel MOS transistor and a N-channel MOS transistor that are connected in series, the control signal being applied to the P-channel MOS transistors of the first and the second series circuits and the inverted control signal being applied to the N-channel transistors of the first and the second series circuits.

In this invention, even at the times when the control input and the inverted control input are at the same potential level either, the P-channel MOS transistors of the first and the second series circuits or the N-channel MOS transistors of the first and the second series circuits are off, so that the totempole current through the pre-output stage circuit during the above times can be prevented and the oscillation of the device can be prevented.

DETAILED DESCRIPTION OF THE PREFERRED EMBODIMENT

An embodiment of the invention will now be described with reference to the drawings.

Figure 1:
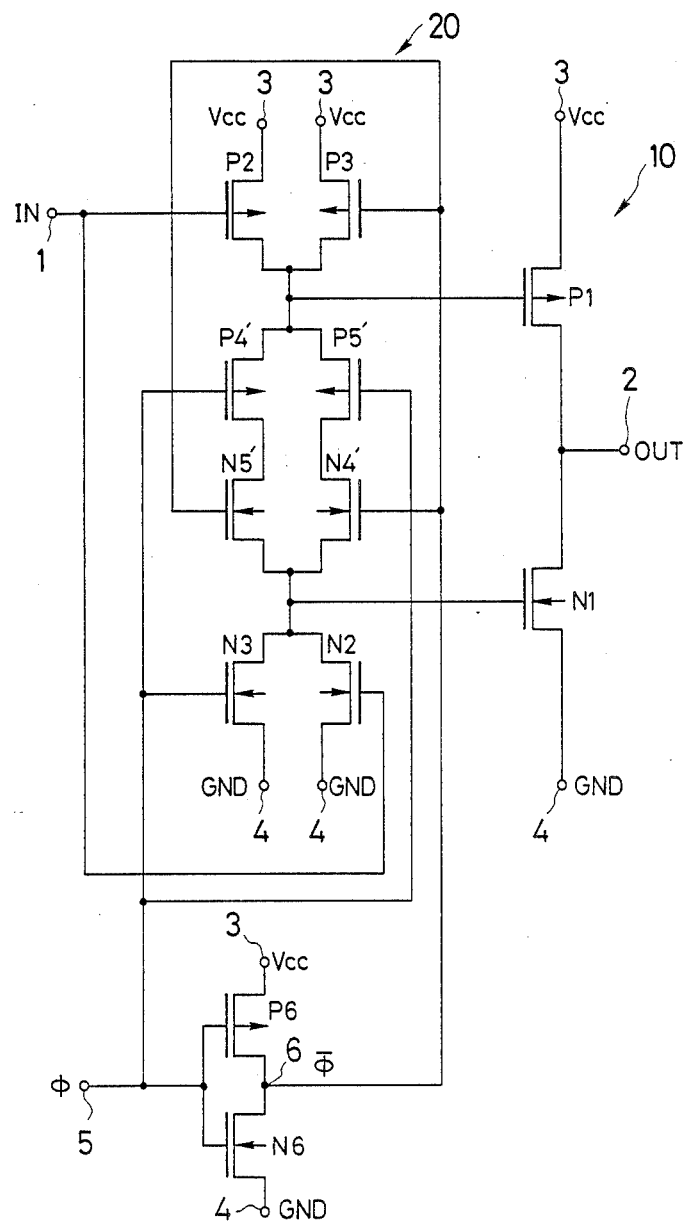
FIG. 1 is a circuit diagram showing a three-state complementary MOS integrated circuit of an embodiment of the invention.
Figure 2:
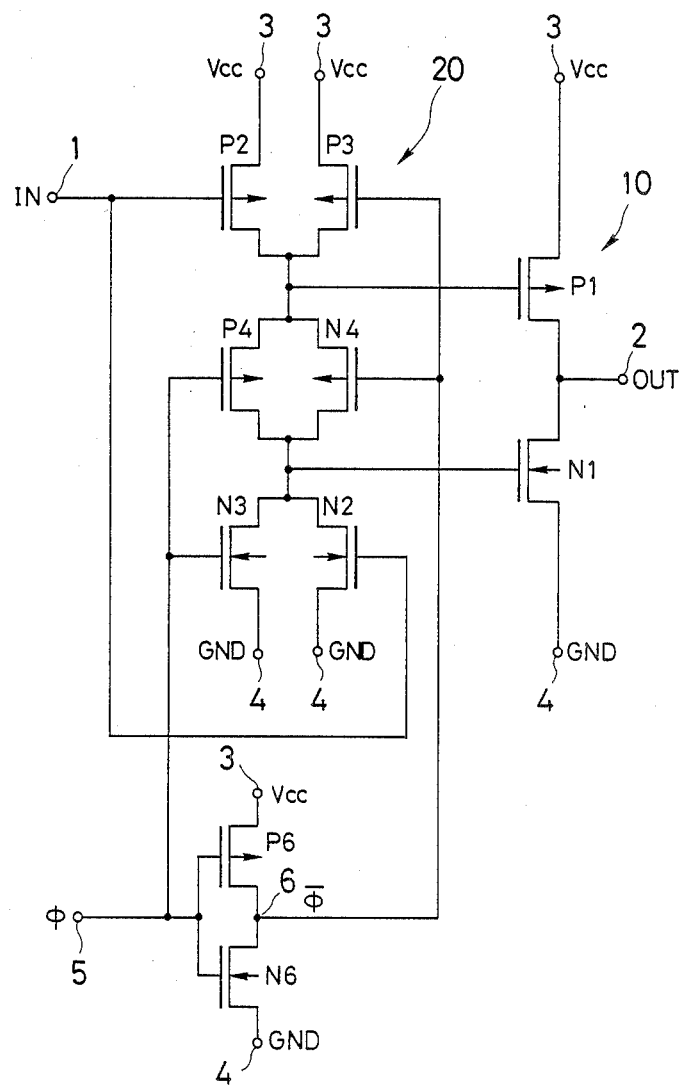
FIG. 2 is a circuit diagram showing a three-state complementary MOS integrated circuit in the prior art.

FIG. 1 shows a three-state complementary MOS integrated circuit of an embodiment of the invention. In the figure, 1 to 6, 10, P1 to P3, P6, N1 to N3, and N6 are the same as in the prior art shown in FIG. 2, and their connection are also identical. P4' and P5' are P-channel MOS transistors having their gates connected to receive the control input $\phi5$. N4' and N5' are N-channel MOS transistors having their gates connected to receive the inverted control input $\bar{\phi}6$. Connected between the gate inputs of the transistors P1 and N1 are a series circuit of the transistors P4' and N5' and a series circuit of the transistors P5' and N4'. 20 is a pre-output stage circuit formed of the transistors P2, P3, P4', P5', N2, N3, N4' and N5'.

The operation will now be described.

As in the prior art, when the control input $\phi5$ is low and the inverted control input $\bar{\phi}6$ is high, the transistors P3 and N3 are off, the trnsistors P'4, P'5, N'4 and N5' are on and the output is in the ENABLE state. Accordingly, when the input terminal is low, a low-level signal appears on the output terminal 2. When the control input $\phi5$ is high and inverted control input $\bar{\phi}6$ is low, the transistors P3 and N3 are on and the transistors P4', P5', N4' and N5' are off. Accordingly, regardless of the state of the input terminal 1, the transistors P1 and N1 are off and the output terminal 2 is in the high-impedance state.

Figure 3:
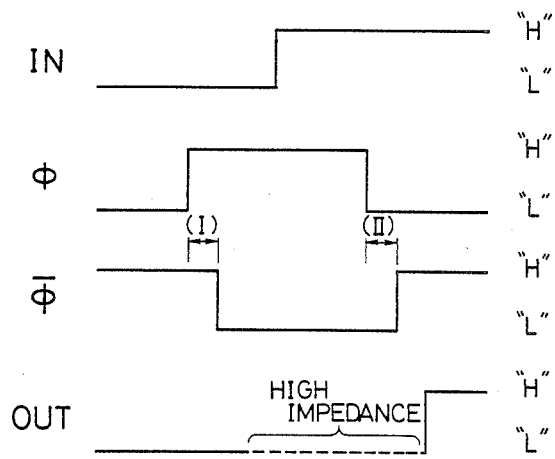
FIG. 3 is a timing chart of the above embodiment and the above prior art.
Figure 4A:
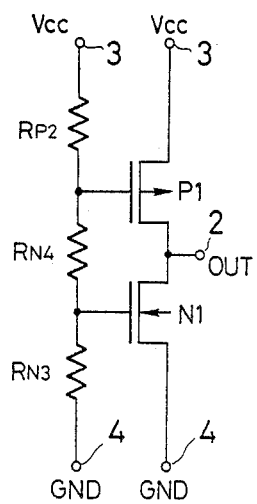
FIGS. 4A and 4B are equivalent circuit diagrams in which the transistors of the prior-art pre-output stage circuit that are on at the times (I) and (II) in FIG. 3 are represented by resistors.
Figure 4B:
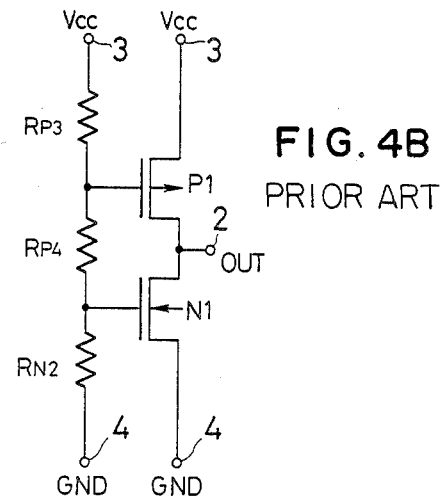

At the time (I) shown in FIG. 3, the transistors P2, N3, N4' and N5' are on and the transistors P3, P4',P5' and N2 are off. At the time (II) shown in FIG. 3, the transistors P3, P4', P5' and N2 are on and the transistors P2, N3, N4' and N5' are off. Thus at either of the times (I) and (II), the current path in the pre-output stage circuit between the power supply and GND terminals is interrupted. As a result, even at the times (I) and (II) when the control input $\phi 5$ and the inverted control input $\overline{\phi} 6$ are at the same potential level, the totempole current through the output circuit is prevented and the oscillation of the device is prevented.

In the above embodiment, the inverted control input $\overline{\phi}$ is delayed from the control input $\phi$. But even when the inverted control input is advanced relative to the control input, configuration according to the invention affords the same merits.

In the above embodiment, complementary MOS integrated circuit is described. But the invention can be applied to Bi-COMOS (bipolar-CMOS) circuit, and provides the same merits.

As has been described according to the three-state complementary MOS integrated circuit of the invention, part of the pre-output stage circuit between the gate inputs of the P-channel and N-channel MOS transistors of the output circuit comprises a parallel circuit of a first series circuit and a second series circuit, the first series circuit comprising a P-channel MOS transistor to which the control signal is input and an N-channel MOS transistor to which the inverted control signal is input, and the second series circuit comprising a P-channel MOS transistor to which the control signal is input and an N-channel MOS transistor to which the inverted control signal is input. As a result, even at the times when the control input and the inverted control input are at the same potential level, the totempole current through the pre-output stage circuit can be prevented and the oscillation of the device can be prevented.

What is claimed is:

1. A three-state complementary MOS integrated circuit comprising
   an output circuit comprising a P-channel MOS transistor and an N-channel MOS transistor that are connected in series between a power supply and a ground, and
   a pre-output stage circuit responsive to a control signal, an inverted control signal and an input signal for driving the output circuit,
   wherein the pre-output stage circuit comprises
   a first parallel circuit of a P-channel MOS transistor having a gate connected to receive the input signal and a P-channel MOS transistor have a gate connected to receive the inverted control signal,
   a second parallel circuit of a first series circuit and a second series circuit, the first series circuit comprising a series connection of a P-channel MOS transistor having a gate connected to receive the control signal and an N-channel MOS transistor having a gate connected to receive the inverted control signal, and the second series circuit comprising a series connection of a P-channel MOS transistor having a gate connected to receive the control signal and an N-channel MOS transistor having a gate connected to receive the inverted control signal, and
   a third parallel circuit of an N-channel MOS transistor having a gate connected to receive the control signal and an N-channel MOS transistor having a gate connected to receive the input signal,
   wherein the first, second and third parallel circuit are series-connected in the stated order between the power supply and the ground, the junction between the first and second parallel circuits is connected to the gate of the P-channel MOS transistor of the output circuit, and the junction between the second and third parallel circuits is connected to the gate of the N-channel MOS transistor of the output circuit.

2. A three-state complementary MOS integrated circuit according to claim 1, wherein the junction between the P-channel MOS transistor and the N-channel MOS transistor of the output circuit constitutes the output terminal of the three-state complementary MOS integrated circuit,
   the P-channel MOS transistor being connected between the output terminal and the power supply terminal and the N-channel MOS transistor being connected between the output terminal and the ground.

3. A three-state complementary MOS integrated circuit according to claim 1, wherein the first parallel circuit is connected between the gate of the P-channel transistor of the output circuit and the power supply terminal and the third parallel circuit is connected between the gate of the N-channel transistor of the output circuit and the ground.

4. A three-state complementary MOS circuit according to claim 1, wherein the power supply terminal has a positive potential with respect to the ground.

* * * * *